United States Patent Office 3,684,533

Patented Aug. 15, 1972

3,684,533

SCREEN PRINTABLE SOLDER COMPOSITIONS

Joel A. Conwicke, Wilmington, Del., assignor to E. I. du Pont de Nemours and Company, Wilmington, Del.

No Drawing. Continuation-in-part of application Ser. No. 880,940, Nov. 28, 1969, which is a continuation-in-part of application Ser. No. 853,195, Aug. 26, 1969. This application May 28, 1970, Ser. No. 41,609
Int. Cl. C09d 5/24
U.S. Cl. 106—1 9 Claims

ABSTRACT OF THE DISCLOSURE

Novel liquid vehicles comprising an active hydrogen-containing compound which is capable of removing surface oxides from soldering metals, rosen (or derivatives thereof) and, optionally, an organic solvent and a thixotropic agent. These vehicles are used to form screen printable solder compositions which contain finely divided solder metals dispersed in the vehicle. The use of this novel vehicle provides good screen printability, good solder flowability at soldering temperatures, and also aids in the formation of good solder bonds. These compositions are particularly suited for soldering electronic circuitry.

CROSS-REFERENCE TO RELATED APPLICATIONS

This is a continuation-in-part of U.S. patent application Ser. No. 880,940, filed Nov. 28, 1969, now abandoned, which is a continuation-in-part of Ser. No. 853,195, filed Aug. 26, 1969, now abandoned.

BACKGROUND OF THE INVENTION

Generally, the soldering of metals is effected by applying a soldering medium or flux on the place to be soldered, and then applying the solder with a soldering iron or the like. Alternatively, solder preforms have been used wherein a preform is heated to a molten state whereby it forms a good solder bond. Various preforms have to be made for each individual situation. Consequently, the entire soldering process is very time consuming and expensive.

Various attempts have been made to produce screen printable solder compositions. More specifically, compositions suitable for use with electronic circuitry are of great utility. In the latter case, the vehicles used must (1) provide good printability, (2) be active and remove surface oxides at the melting point of the solder metals, and (3) leave a non-corrosive and non-conductive residue. Heretofore, these advantages have not been fully obtainable in screen printable solder compositions. More specifically, the prior compositions have poor screen printability, poor wetting properties, poor solderability, and the amount of flux residue has been high. The latter results in poor solder bonding and may degrade electrical and thermal properties.

It is the object of this invention to provide a new and improved liquid vehicle which can be used to produce screen printable solder compositions that overcome the deficiencies of the prior art.

SUMMARY OF THE INVENTION

This invention relates to liquid vehicles comprising, on a weight basis, (a) 0.01–75% of active hydrogen-containing compound selected from the group consisting of hydroxyl substituted aliphatic amines in which the hydroxyl and nitrogen are in a vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring nitrogen, and mixtures thereof, (b) 1–75% of rosin or derivatives thereof, (c) 0–75% of an organic solvent, and (d) 0–20% of a thixotropic agent. These novel vehicles are used to form screen printable solder compositions which contain a finely divided solder metal dispersed in said liquid vehicle.

DESCRIPTION OF THE PREFERRED EMBODIMENTS

A critical and essential ingredient in the liquid vehicles is the active hydrogen-containing compound which is capable of removing surface oxide from the soldering metals. This compound must be active above the melting point of the solder metals so that the surface oxides of the solder metals are removed. In addition, the compound must enhance solder flow, solder wetting and in many instances, leave a non-corrosive, electrically non-conductive residue. The particular active hydrogen-containing compounds are hydroxyl substituted aliphatic amines in which the hydroxyl and nitrogen are in a vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring nitrogen, and mixtures thereof. The term "vicinal" denotes neighboring or adjoining positions on a carbon ring or chain. Suitable compounds include diethanolamine, triethanolamine, 2-hydroxyquinoline, 8-hydroxyquinoline, α-hydroxymethyl pyridine 2(2-aminoethylamino) ethanol, diglycolamine, N-hydroxyethyl ethylenediamine. It is not intended that the specific exemplary compounds be limitive; any active hydrogen-containing compounds within the above-described generic classes of compounds can be used for purposes of this invention.

The operable proportions of the active hydrogen-containing compound ranges from 0.01–75% with the preferred range being from 1–10%. Any small amount of the active hydrogen compound will improve the above-described properties. As the amount of this compound is increased above 10%, the residue (after soldering) can become increasingly corrosive, depending on the particular compound used and vehicle volatilization becomes more rapid. If more than 75% is used, the residue is excessively corrosive and vehicle volatilization too rapid.

The second component of the vehicle is rosin or derivatives thereof. Rosin, the nonsteam-volatile fraction of pine oleoresin, is a mixture of five isomeric diterpene acids, the most abundant component being abietic acid. The terminology "rosin and derivatives thereof" includes rosin, the acids in rosin, wood rosin, and any of their derivatives, such as Stabelite®, Poly-Pale®, Dymerex®, Vinsol®, etc. The purpose of the rosin is to increase the viscosity of the vehicle to a printing consistency, to act as a flux and to enhance storage stability. At least 1% rosin must be utilized while the use of more than 75% provides vehicles which have a very high viscosity and poor printability properties. A preferred amount of rosin ranges between 30% and 60%.

The third component of the vehicle is an organic solvent. This is an optional ingredient which may be present in amounts constituting up to 75% of the vehicle. The organic solvent should dissolve the resin acids. In addition, the solvent provides the proper consistency for the vehicle which is to be used in screen printable solder compositions. If more than 75% solvent is present, the finely divided solder metal will not remain dispersed in the liquid vehicle of a screen printable solder composition. The preferred amount of solvent ranges between 40 and 60%. Any of the common organic solvents may be used; typical solvents include acetone, benzene, toluene, aliphatic alcohols, mineral spirits, carbon tetrachloride, the terpenes (e.g., beta-terpineol), ethylene glycol, glycerol, methyl ethyl ketone, and mixtures thereof.

The fourth component of the vehicle is a thixotropic agent. This also is an optional ingredient and may be present in amounts constituting up to 20% of the vehicle. Its purpose is to increase the viscosity of the vehicle to a printing consistency and to increase the loading capacity of the vehicle. The presence of more than 20% thixotropic agent severely hinders the coalescing power of this vehicle system. A preferred amount of thixotropic agent ranges between 0.5 and 10%. Any thixotropic agent can be used provided that it does not leave an organic solvent (e.g., trichloroethylene, Freon®, etc.), insoluble residue on the solder metal after the firing operation is performed. Common thixotropic agents are disclosed by Eirich, "Rheology," vol. 4, p. 457. A preferred thixotropic agent is hydrogenated castor oil (Thixatrol).

Other conventional screen printing constituents, viscosity modifiers, etc. may also be present in the printable solder compositions of this invention. Common rheology modifiers may be included provided they do not adversely affect the properties of the compositions.

The liquid vehicle is prepared by simply admixing the components and/or dissolving one component in another. Any well known techniques of preparing a liquid system may be utilized.

The screen printable solder compositions contain finely divided solder metals dispersed in the liquid vehicle. The solder metals can be any of the conventional single or multiphase metals normally used for soldering, including gold, silver, tin, germanium, silicon, antimony, bismuth, lead, indium, gallium, zinc, copper, phosphorous, alloys thereof and mixtures thereof. The solder metal particles should be smaller than 100 mesh.

The screen printable solder compositions are conventionally made by admixing the solder metals and the vehicle in any ratio, but preferably at ratios between 1:20 to 20:1. The screen printable solder compositions may then be applied to any suitable substrate, particularly metal substrates, to form a solder pad. Thereafter, the solder is heated to a temperature where the solder becomes molten and a highly adherent solder bond is formed. Any atmosphere may be used but inert or reducing atmospheres (non-oxidizing) are preferred.

The invention is illustrated by the following examples. In the examples and elsewhere in the specification all parts, percentages and proportions of material or components are by weight.

Various liquid vehicles and screen printable solder compositions were prepared. The specific amounts of the constituents utilized are reported in Table I. The vehicles were prepared by dissolving abietic acid and, optionally, a thixotropic agent in a mixture of beta-terpineol and the active hydrogen compound. The dissolving was accelerated by heating the mixture for 15–20 minutes. After cooling the vehicle, finely divided solder metals were dispersed therein to form screen printable solder compositions. These compositions were printed onto a preformed conductor pad on an alumina substrate. The entire substrate was then heated in an inert atmosphere to the soldering temperature as specified in Table I. The properties of the solder were observed and also reported in Table I.

TABLE I

| | Example | | | | | | | |
|---|---|---|---|---|---|---|---|---|
| | 1 | 2 | 3 | 4 | 5 | 6 | 7 | 8 |
| Vehicle (weight percent) | 25 | 25 | 25 | 20 | 40 | 30 | 20 | 15 |
| 1. β-terpineol | 53 | 90 | 50 | 50 | 60 | 45 | 50 | 50 |
| 2. Abietic acid | 45 | | 45 | 46 | 30 | 45 | 41 | 41 |
| 3. Triethanolamine | 2 | | | 4 | 10 | 10 | 2 | 2 |
| 4. Diethanolamine | | | 5 | | | | | |
| 5. Ethyl cellulose | | 10 | | | | | | |
| 6. Hydrogenated caster oil | | | | | | | 7 | 7 |
| Metal (weight percent) | 75 | 75 | 75 | 80 | 60 | 70 | 80 | 85 |
| 1. Gold | 80 | 80 | 80 | | | 82 | | |
| 2. Silver | | | | | | | | |
| 3. Tin | 20 | 20 | 20 | 95 | 100 | 15 | 95 | 95 |
| 4. Germanium | | | | | | 3 | | |
| 5. Antimony | | | | 5 | | | 5 | |
| Screen printability | (1) | (2) | (2) | (2) | (3) | (3) | (1) | (1) |
| Solder wetting | (1) | (4) | (1) | (2) | (2) | (2) | (1) | (1) 5 |
| Temperature, ° C | 310 | 310 | 310 | 260 | 260 | 310 | 290 | 290 |
| Residue | (5) | (6) | (7) | (5) | (5) | (5) | (5) | (5) |

[1] Excellent; [2] Good; [3] Fair; [4] None; [5] Low; [6] High; [7] Moderate.

It can be seen from the tabulated data in Table I that use of the novel vehicle in screen printable solder compositions produces good results while overcoming the deficiencies of the prior art. In particular, Example 2, which utilized a common screen printing vehicle, did not produce the superior results obtainable with the vehicle of this invention. Specifically, the examples demonstrate the good screen printing capabilities, good solder wetting and non-corrosive and eletrically non-conductive residue. In addition, the compositions of this invention were stable when stored for several months.

I claim:

1. A screen printable solder composition containing finely divided solder metal dispersed in a liquid vehicle wherein said vehicle consists essentially of, on a weight basis, (a) 0.01–75% of active hydrogen-containing compound selected from the group consisting of hydroxyl substituted aliphatic amines in which the hydroxyl and nitrogen are in a vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring nitrogen, and mixtures thereof (b) 1–75% of rosin or derivatives thereof, (c) 0–75% of an organic solvent, and (d) 0–20% of a thixotropic agent, the metal/vehicle ratio being in the range 1/20 to 20/1.

2. A composition in accordance with claim 1 wherein the active hydrogen-containing compound is triethanolamine.

3. A composition in accordance with claim 1 wherein the metal is from the group consisting of gold, silver, tin, germanium, lead, antimony, alloys thereof and mixtures thereof.

4. A composition in accordance with claim 1 wherein the metal contains gold.

5. A composition in accordance with claim 1 wherein the active hydrogen-containing compound is diethanolamine.

6. A screen printable solder composition containing finely divided solder metal dispersed in a liquid vehicle wherein said vehicle consists essentially of, on a weight basis, (a) 1–10% of active hydrogen-containing compound selected from the group consisting of hydroxyl substituted aliphatic amines in which the hydroxyl and nitrogen are in a vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring nitrogen, and mixtures thereof, (b) 30–60% of rosin or derivatives thereof, (c) 40–60% of an organic solvent, and (d) 0.5–10% of a thixotropic agent, the metal/vehicle ratio being in the range 1/20 to 20/1.

7. A composition in accordance with claim 6 wherein the thixotropic agent is hydrogenated castor oil.

8. A composition in accordance with claim 6 wherein the active hydrogen-containing compound is triethanolamine.

9. A composition in accordance with claim 6 wherein the active hydrogen-containing compound is diethanolamine.

References Cited

UNITED STATES PATENTS

| | | | |
|---|---|---|---|
| 2,829,998 | 4/1958 | Glynn | 148—23 |
| 3,527,625 | 9/1970 | Mollring | 148—24 |
| 3,597,285 | 8/1971 | Aronberg | 148—26 |
| 3,602,682 | 8/1971 | Hoeffleur | 148—24 X |
| 2,240,151 | 4/1941 | Wampner | 106—193 X |
| 2,864,719 | 12/1958 | Willis | 106—193 X |
| 3,085,890 | 4/1963 | Rolles | 106—241 |
| 3,484,284 | 12/1969 | Dates et al. | 106—1 X |
| 3,537,892 | 11/1970 | Milkovich et al. | 106—1 X |

LORENZO B. HAYES, Primary Examiner

U.S. Cl. X.R.

106—236, 241; 117—123 B, 131, 227; 148—24; 252—512; 514